(12) United States Patent
Kim et al.

(10) Patent No.: US 7,729,164 B2
(45) Date of Patent: Jun. 1, 2010

(54) NON-VOLATILE MEMORY DEVICE, METHOD OF OPERATING THE SAME, AND METHOD OF FABRICATING THE SAME

(75) Inventors: Suk-pil Kim, Yongin-si (KR); Yoon-dong Park, Yongin-si (KR); Deok-kee Kim, Seoul (KR); Won-joo Kim, Hwaseong-si (KR); Young-gu Jin, Hwaseong-si (KR); Seung-hoon Lee, Seoul (KR)

(73) Assignee: Samsung Elctronics Co., Ltd., Gyeonggi-do (KR)

( * ) Notice: Subject to any disclaimer, the term of this patent is extended or adjusted under 35 U.S.C. 154(b) by 156 days.

(21) Appl. No.: 12/010,943

(22) Filed: Jan. 31, 2008

(65) Prior Publication Data

US 2009/0097321 A1    Apr. 16, 2009

(30) Foreign Application Priority Data

Oct. 12, 2007    (KR)    ...................... 10-2007-0103164

(51) Int. Cl.
  *G11C 11/34*    (2006.01)

(52) U.S. Cl. ............. 365/185; 365/185.21; 365/182.26; 365/185.27

(58) Field of Classification Search ............ 365/185.18, 365/185.26, 185.27, 185.21
See application file for complete search history.

(56) References Cited

U.S. PATENT DOCUMENTS

| 7,566,929 B2 * | 7/2009 | Lee et al. | ..................... 257/315 |
| 2005/0253183 A1 * | 11/2005 | Umezawa et al. | ........... 257/315 |
| 2007/0284646 A1 * | 12/2007 | Kikuchi et al. | .............. 257/315 |

* cited by examiner

*Primary Examiner*—Pho M. Luu
(74) *Attorney, Agent, or Firm*—Harness, Dickey & Pierce, P.L.C.

(57) ABSTRACT

A non-volatile memory device may include at least one semiconductor layer, a plurality of control gate electrodes, a plurality of charge storage layers, at least one first auxiliary electrode, and/or at least one second auxiliary electrode. The plurality of control gate electrodes may be recessed into the semiconductor layer. The plurality of charge storage layers may be between the plurality of control gate electrodes and the semiconductor layer. The first and second auxiliary electrodes may be arranged to face each other. The plurality of control gate electrodes may be between the first and second auxiliary electrodes and capacitively coupled with the semiconductor layer.

38 Claims, 8 Drawing Sheets

NON-VOLATILE MEMORY DEVICE, METHOD OF OPERATING THE SAME, AND METHOD OF FABRICATING THE SAME

PRIORITY STATEMENT

This application claims the benefit of priority to Korean Patent Application No. 10-2007-0103164, filed on Oct. 12, 2007, in the Korean Intellectual Property Office, the entire contents of which are incorporated herein in their entirety by reference.

BACKGROUND

1. Field

Example embodiments relate to a semiconductor device, and for example, to a non-volatile memory device that may record or erase data by using charge storage layers, a method of operating the same, and/or a method of fabricating the same.

2. Description of Related Art

Semiconductor products are becoming increasingly miniaturized and are being required to operate at higher speeds. Therefore, more highly integrated non-volatile memory devices having better performance are in demand for use as semiconductor products. However, the ability of planar type non-volatile memory devices to support increased capacity and speed is restricted due to the limitation of integration technology of the planar type non-volatile memory devices.

In order to improve the performance of a non-volatile memory device, a conventional three-dimensional non-volatile memory device may be used. For example, a conventional three-dimensional non-volatile memory device may be fabricated by using a silicon-on-insulator (SOI) substrate. A conventional three-dimensional non-volatile memory device may have a larger channel area than a planar type non-volatile memory device, and therefore, may operate at a higher speed.

In order to improve integration of a conventional non-volatile memory device, a multilayer stack structure may be employed. If memory cells are stacked into multilayers, a higher capacity non-volatile memory device may be fabricated on a same plane.

However, source and drain regions are disposed on broad regions of the conventional three-dimensional non-volatile memory device. For example, the source and drain regions are disposed on broad regions of a conventional non-volatile memory device having a NOT AND (NAND) structure, which is a restriction imposed to improve integration of the conventional non-volatile memory device. Furthermore, stacking multilayers of the conventional three-dimensional non-volatile memory device incurs a higher cost and the quality of a single crystal layer may not be as easily ensured.

SUMMARY

Example embodiments provide a non-volatile memory device that may have higher performance and be more highly integrated.

Example embodiments provide a method of operating the non-volatile memory device.

Example embodiments provide a method of economically fabricating the non-volatile memory device.

According to an example embodiment, a non-volatile memory device may include at least one semiconductor layer, a plurality of control gate electrodes, a plurality of charge storage layers, at least one first auxiliary electrode, and/or at least one second auxiliary electrode. The plurality of control gate electrodes may be recessed into the semiconductor layer. The plurality of charge storage layers may be between the plurality of control gate electrodes and the semiconductor layer. The first and second auxiliary electrodes may be arranged to face each other. The plurality of control gate electrodes may be between the first and second auxiliary electrodes and capacitively coupled with the semiconductor layer.

According to an example embodiment, the non-volatile memory device may further include a plurality of tunneling insulation layers between the plurality of charge storage layers and the semiconductor layer. The plurality of tunneling insulation layers may be connected to each other.

According to an example embodiment, the plurality of tunneling insulation layers may separate the semiconductor layer into first and second regions about the plurality of control gate electrodes. The first auxiliary electrode may be recessed into the first region and the second auxiliary electrode may be recessed into the second region. The non-volatile memory device may further include a first dielectric layer between the first auxiliary electrode and the semiconductor layer; and a second dielectric layer between the second auxiliary electrode and the semiconductor layer.

According to an example embodiment, the non-volatile memory device may further include a plurality of blocking insulation layers between the plurality of control gate electrodes and the plurality of charge storage layers.

According to another example embodiment, the at least one semiconductor layer may be a plurality of semiconductor layers. The plurality of control gate electrodes may be extended to penetrate the plurality of semiconductor layers. The plurality of charge storage layers may be between the plurality of control gate electrodes and the plurality of semiconductor layers. The at least one first auxiliary electrode may be a plurality of first auxiliary electrodes on first sides of the plurality of control gate electrodes and are capacitively coupled with the plurality of semiconductor layers. The at least one second auxiliary electrode may be a plurality of second auxiliary electrodes on second sides of the plurality of control gate electrodes and are capacitively coupled with the plurality of semiconductor layers.

According to an example embodiment, the non-volatile memory device may further include a plurality of bit line plugs at ends of the plurality of control gate electrodes. The plurality of bit line plugs may be extended to penetrate the plurality of semiconductor layers.

According to an example embodiment, the non-volatile memory device may further include a plurality of common source line plugs at the other ends of the plurality of control gate electrodes. The plurality of common source line plugs may be extended to penetrate the plurality of semiconductor layers.

According to still another example embodiment, a method of operating a non-volatile memory device may include performing a program operation including storing data into at least one of a plurality of memory cells connected to each other by a NAND (NOT AND) string between a bit line and a common source line. The NAND string may include first and second pages, and the program operation may include a first page program operation including applying a ground voltage to a first auxiliary line capacitively coupled with the first page of a semiconductor layer and applying a program inhibition voltage to a second auxiliary line capacitively coupled with the second page of the semiconductor layer.

According to an example embodiment, the program operation may further include a second page program operation including applying the program inhibition voltage to the first auxiliary line capacitively coupled with the first page of the semiconductor layer and applying the ground voltage to the second auxiliary line capacitively coupled with the second page of the semiconductor layer.

According to an example embodiment, the method may further include performing a read operation including reading data from at least one of the memory cells. The read operation may include a first page read operation including applying a ground voltage to the first auxiliary line capacitively coupled with the first page of the semiconductor layer and applying a read inhibition voltage to the second auxiliary line capacitively coupled with the second page of the semiconductor layer.

According to an example embodiment, the read operation may further include a second page read operation including applying the read inhibition voltage to the first auxiliary line capacitively coupled with the first page of the semiconductor layer and applying the ground voltage to the second auxiliary line capacitively coupled with the second page of the semiconductor layer.

According to another example embodiment, a method of fabricating a non-volatile memory device may include forming a plurality of charge storage layers in a semiconductor substrate. A plurality of control gate electrodes may be formed on the plurality of charge storage layers. At least one first auxiliary electrode may be formed on first sides of the plurality of control gate electrodes and capacitively coupled with the semiconductor substrate. At least one second auxiliary electrode may be formed on second sides of the plurality of control gate electrodes and capacitively coupled with the semiconductor substrate.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
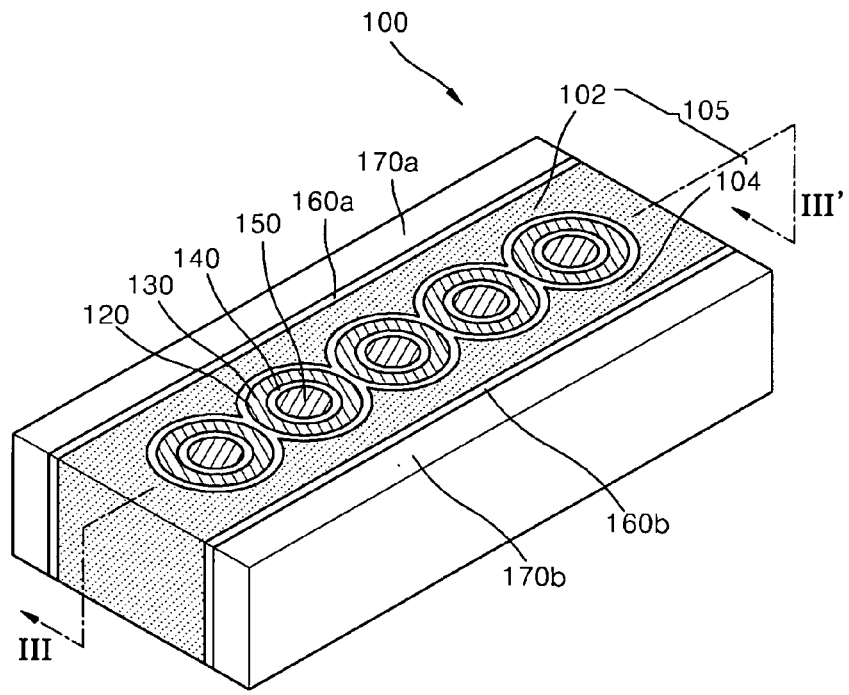
FIG. 1 is a perspective view of a non-volatile memory device according to an example embodiment.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 2:
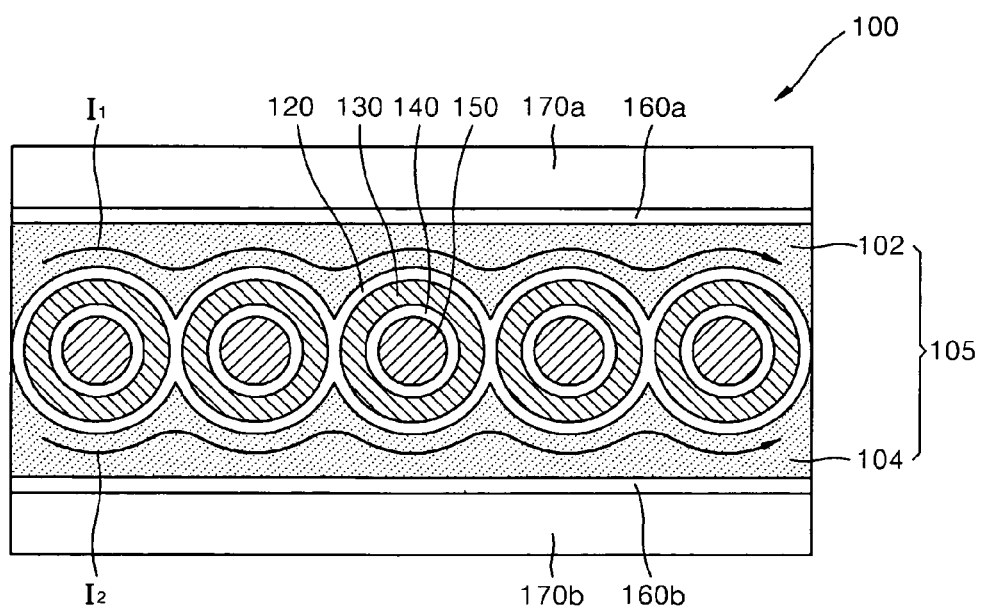
FIG. 2 is a plan view of the non-volatile memory device illustrated in FIG. 1.
Figure 3:
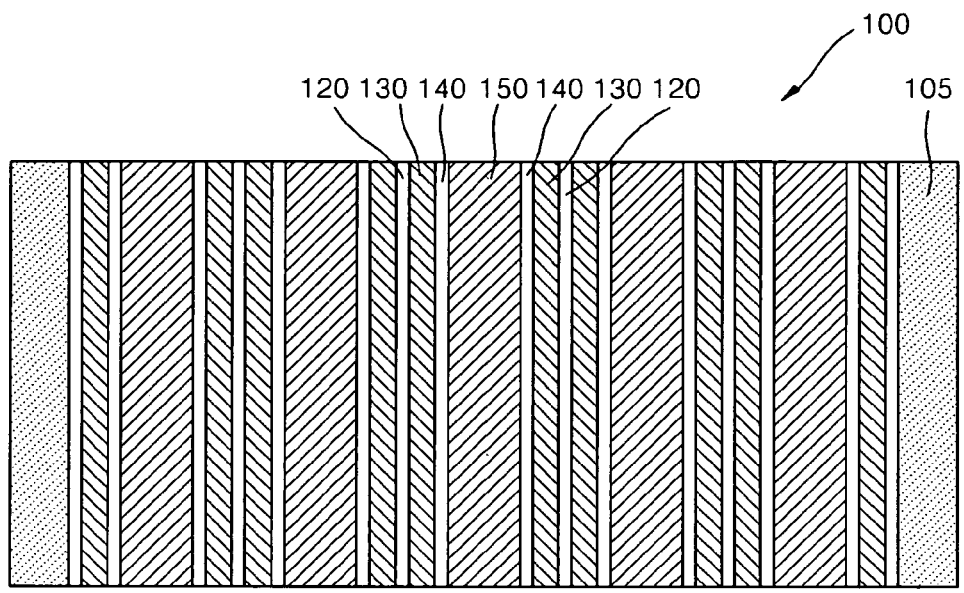
FIG. 3 is a cross-sectional view of the non-volatile memory device illustrated in FIG. 1 which is cut along the line III-III'.

FIG. 1 is a perspective view of a non-volatile memory device 100 according to an example embodiment. FIG. 2 is a plan view of the non-volatile memory device 100 illustrated in FIG. 1. FIG. 3 is a cross-sectional view of the non-volatile memory device 100 illustrated in FIG. 1, which is cut along the line III-III'.

Referring to FIGS. 1 through 3, a semiconductor layer 105 may be provided as a part of a bulk semiconductor wafer. For example, the bulk semiconductor wafer may include a silicon wafer, a germanium wafer, and/or a silicon-germanium wafer. As another example, the semiconductor layer 105 may be provided as a semiconductor epitaxial layer on the bulk semiconductor wafer. The semiconductor layer 105 may include first and second regions 102 and 104 to be described later.

A plurality of control gate electrodes 150 may be arranged to be recessed into the semiconductor layer 105. For example, the control gate electrodes 150 may be formed in recesses or trenches of the semiconductor layer 105. The control gate electrodes 150 may be arranged to penetrate the semiconductor layer 105.

For example, the control gate electrodes 150 may have circular column shapes and may induce radial electric fields in the semiconductor layer 105. As another example, the control gate electrodes 150 may have oval or polygonal column shapes.

A plurality of charge storage layers 130 may be disposed between the control gate electrodes 150 and the semiconductor layer 105. The charge storage layers 130 may be used as charge storage media for a data program. For example, the charge storage layers 130 may allow the non-volatile memory device 100 to operate as a floating gate type device or a charge trap type device.

For example, for the floating gate type device, the charge storage layers 130 may include a conductive material, e.g., a polysilicon layer, and/or for the charge trap type device, the charge storage layers 130 may include a silicon nitride layer, quantum dots or nanocrystals. The quantum dots or nanocrystals may include a conductive material, for example, fine particles of metal or silicon. The charge storage layers 130 used in the charge trap type device may locally store charges and/or may be used for a multibit operation.

A plurality of tunnelling insulation layers 120 may be disposed between the semiconductor layer 105 and the charge storage layers 130. The tunnelling insulation layers 120 may be used as tunnelling paths of charges and may have a desired, or alternatively, a predetermined thickness, for example the tunnelling insulation layers 120 may have a thickness in accordance with an operation voltage. A plurality of blocking insulation layers 140 may be disposed between the charge storage layers 130 and the control gate electrodes 150. For example, the tunnelling insulation layers 120 and the blocking insulation layers 140 may include an oxide layer, a nitride layer, and/or a high-k dielectric layer. The high-k dielectric layer may be an insulation layer having a dielectric constant larger than dielectric constants of an oxide or a nitride.

The blocking insulation layers 140, the charge storage layers 130, and/or the tunnelling insulation layers 120 may be sequentially formed around side walls of the control gate electrodes 150. For example, the blocking insulation layers 140 may surround the control gate electrodes 150, the charge storage layers 130 may surround the blocking insulation layers 140, and/or the tunnelling insulation layers 120 may surround the charge storage layers 130. Accordingly, the tunnelling insulation layers 120, the charge storage layers 130, and/or the blocking insulation layers 140 may have tube shapes. However, example embodiments are not limited thereto, and the tunnelling insulation layers 120, the charge storage layers 130 may have other shapes.

A pair of tunnelling insulation layers 120 may contact each other. Therefore, the semiconductor layer 105 may be separated into the first and second regions 102 and 104 by the tunnelling insulation layers 120. In memory cells, the tunnelling insulation layers 120 may be continuously connected to each other and first and second regions 102 and 104 may be used as separate channel regions. Accordingly, a first current $I_1$ may be induced if a channel is formed in the first region 102 and/or a second current $I_2$ may be induced if a channel is formed in the second region 104.

If the memory cells are arranged as a NAND string, the first and second regions 102 and 104 may not be separated at an end of the NAND string to which a common source line may be connected. Accordingly, the semiconductor layer 105 near the common source line may be used to apply a substrate bias voltage.

First and second auxiliary electrodes 170a and 170b may be disposed on either side of the control gate electrodes 150 to face each other, and/or may be capacitively coupled with the semiconductor layer 105. The first and second auxiliary electrodes 170a and 170b may be used to control electric potentials of the first and second regions 102 and 104, which will be described later.

For example, the first auxiliary electrode 170a may be arranged to be recessed into the first region 102 and/or the second auxiliary electrode 170b may be arranged to be recessed into the second region 104. The first and second auxiliary electrodes 170a and 170b may be arranged along sides of the control gate electrodes 150 in a line or may be symmetrically arranged with respect to each other.

A first dielectric layer 160a may be disposed between the first auxiliary electrode 170a and the semiconductor layer 105 and/or a second dielectric layer 160b may be disposed between the second auxiliary electrode 170b and the semiconductor layer 105. For example, the first and second dielectric layers 160a and 160b may include a desired, or alternatively, a predetermined insulation layer, e.g., an oxide layer, a nitride layer, and/or a high-k dielectric layer.

Although the control gate electrodes 150 are shared by the first and second regions 102 and 104, the electric potentials of the first and second regions 102 and 104 may be separately controlled by using the first and second auxiliary electrodes 170a and 170b. Accordingly, the first and second currents $I_1$ and $I_2$ may be independently controlled.

Therefore, the non-volatile memory device 100 may represent a case where a NAND string includes two pages and/or may process at least two bits of data. However, in order to process the two bits of data, the charge storage layers 130 may be selected to form the charge trap type device.

In the non-volatile memory device 100, the first and second currents $I_1$ and $I_2$ may be induced between the memory cells. e.g., by using the radial electric fields, without source and drain regions. A first channel inducing the first current $I_1$ may be continuously formed in the first region 102 without source and drain regions. A second channel inducing the second current $I_2$ may be continuously formed in the second region 104 without source and drain regions. Accordingly, source and drain regions may be omitted and the non-volatile memory device 100 may be more highly integrated.

Figure 4:
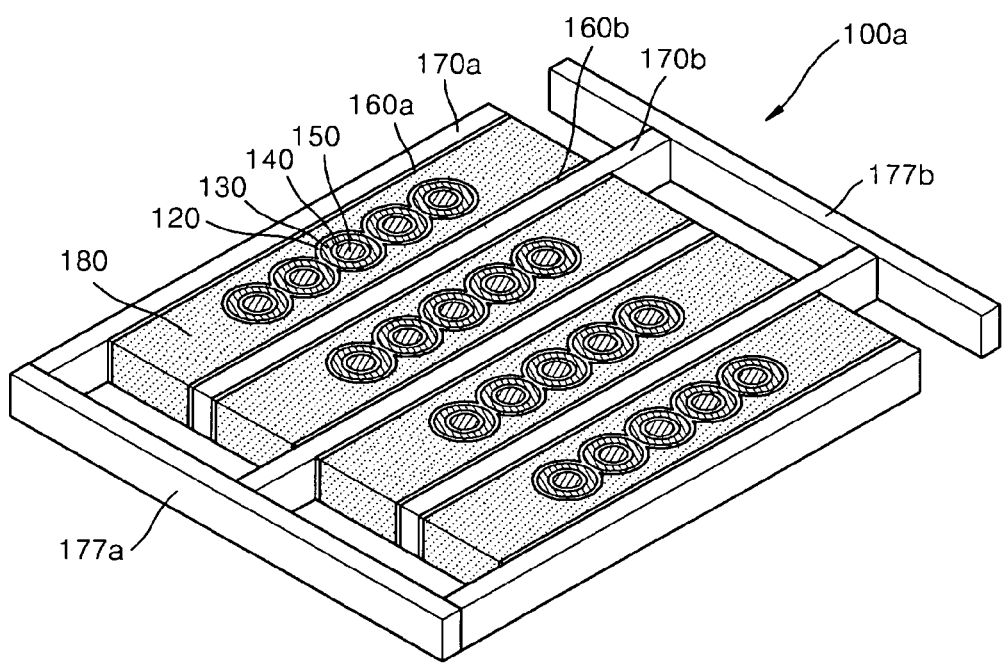
FIG. 4 is a perspective view of a non-volatile memory device according to another example embodiment.

FIG. 4 is a perspective view of a non-volatile memory device 100a according to another example embodiment.

Referring to FIG. 4, the non-volatile memory device 100a may correspond to a plurality of the non-volatile memory devices 100 illustrated in FIGS. 1 through 3 arranged in an array structure. For example, the non-volatile memory device 100 illustrated in FIGS. 1 through 3 may represent a NAND string having two pages while the non-volatile memory device 100a may represent an array arrangement of a plurality of NAND strings. For example, first and second auxiliary electrodes 170a and 170b may be shared by neighboring NAND strings.

The first auxiliary electrodes 170a may commonly be connected to a first auxiliary line 177a. The second auxiliary electrodes 170b may commonly be connected to a second auxiliary line 177b. Therefore, the NAND strings may be separated into first and second pages by using the first and second auxiliary lines 177a and 177b.

Figure 5:
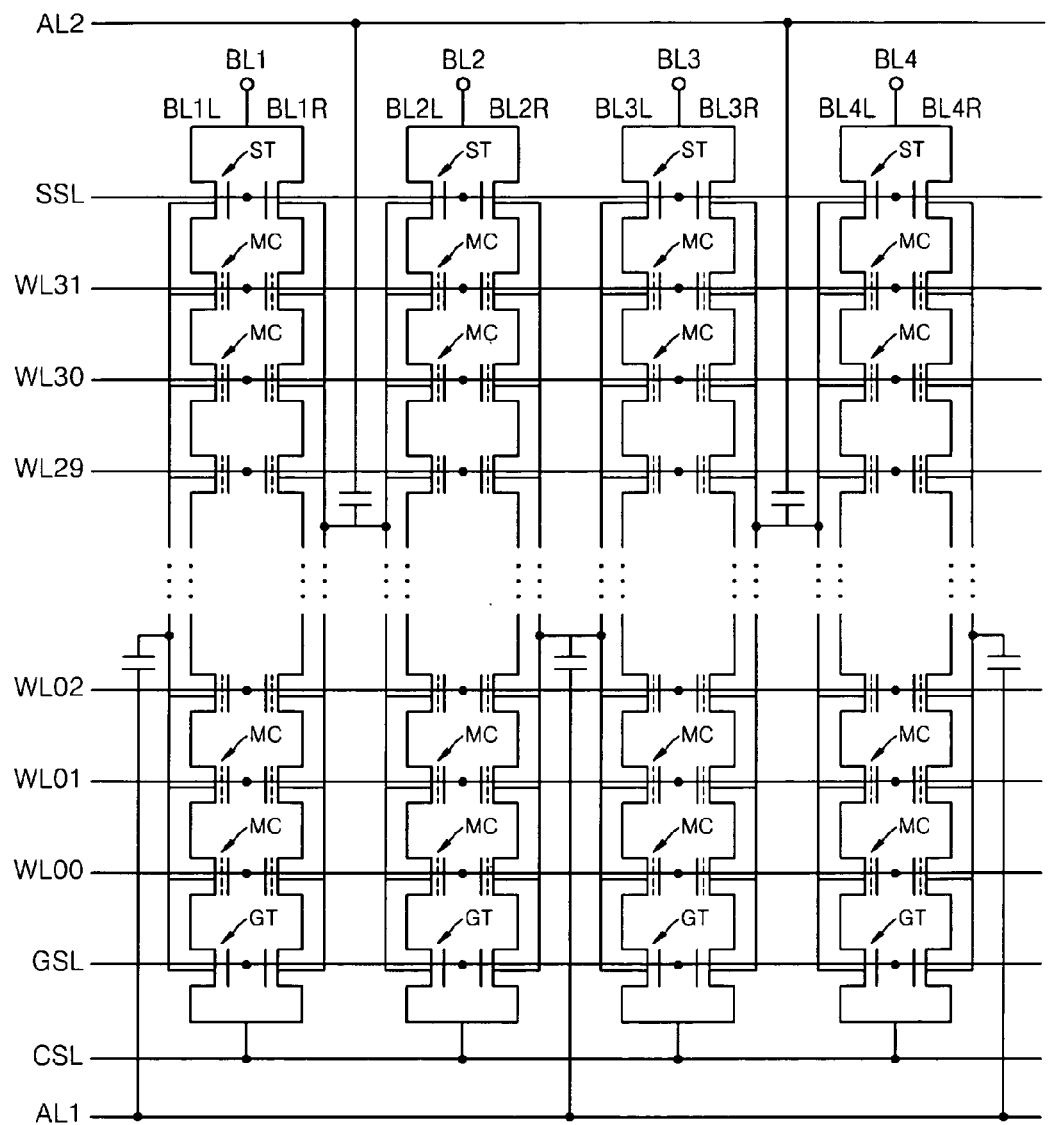
FIG. 5 is an example equivalent circuit diagram of the non-volatile memory device illustrated in FIG. 4 according to an example embodiment.

FIG. 5 is an example equivalent circuit diagram of the non-volatile memory device 100a illustrated in FIG. 4 according to an example embodiment.

Referring to FIG. 5, a plurality of memory cells MC may be arranged in a NAND cell array structure between a plurality of bit lines BL1, BL2, BL3, and BL4 and a common source line CSL. However, each of the bit lines BL1, BL2, BL3, and BL4 may be commonly connected to a pair of pages. A plurality of first pages BL1L, BL2R, BL3L, and BL4R may correspond to the first region 102 illustrated in FIG. 4 and/or a plurality of second pages BL1R, BL2L, BL3R, and BL4L may correspond to the second region 104 illustrated in FIG. 4.

A plurality of word lines WL00 through WL31 may correspond to the control gate electrodes 150 illustrated in FIG. 4. A string selection line SSL may be coupled with a plurality of string selection transistors ST between the bit lines BL1, BL2, BL3, and BL4 and the memory cells MC. The number of word lines WL00 through WL31 and the number of bit lines BL1, BL2, BL3, and BL4 shown in FIG. 5 are exemplarily and the scope of example embodiments is not limited thereto.

A ground selection line GSL may be coupled with a plurality of ground selection transistors GT between the memory cells MC and the common source line CSL. Although omitted in FIG. 4, the structure of the string selection transistors ST and the ground selection transistors GT is obvious to those of ordinary skill in the art.

A first auxiliary line AL1 may be capacitively coupled with channel regions of the memory cells MC in the first pages BL1L, BL2R, BL3L, and BL4R, i.e., the first region 102 of the semiconductor layer 105 illustrated in FIGS. 1 and 2. A second auxiliary line AL2 may be capacitively coupled with channel regions of the memory cells MC in the second pages BL1R, BL2L, BL3R, and BL4L, i.e., the second region 104 of the semiconductor layer 105 illustrated in FIGS. 1 and 2.

Figure 6:
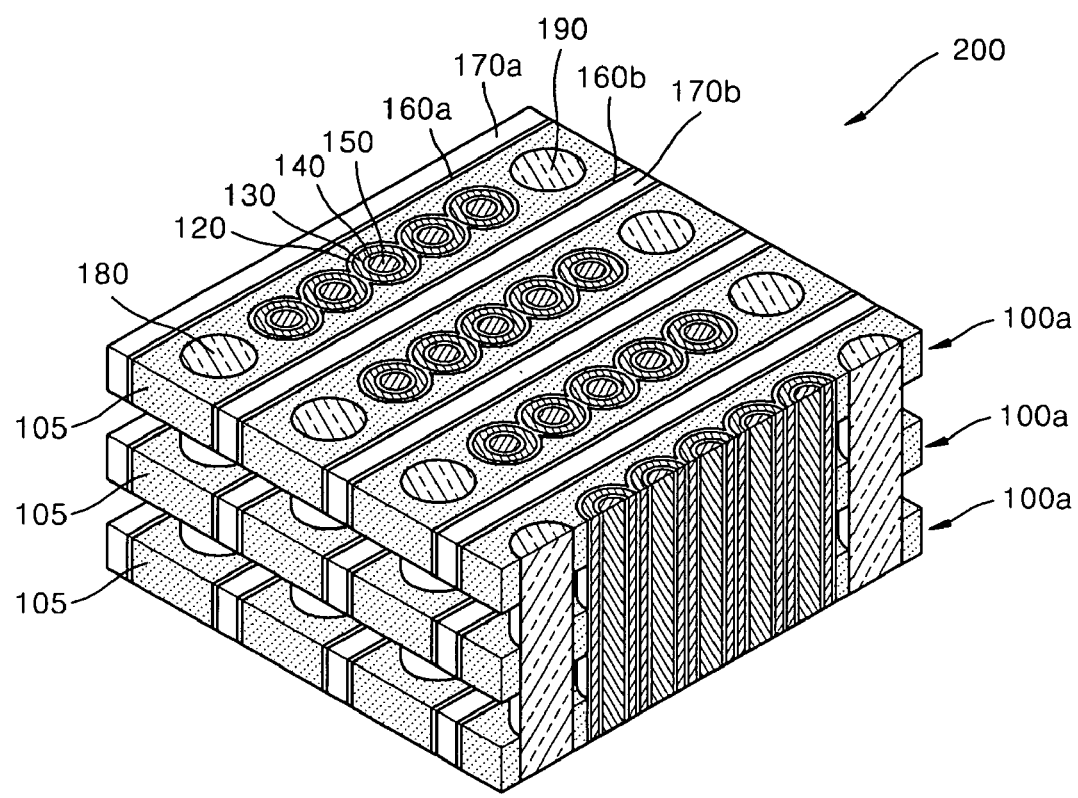
FIG. 6 is a perspective view of a non-volatile memory device according to another example embodiment.

FIG. 6 is a perspective view of a non-volatile memory device 200 according to another example embodiment.

Referring FIG. 6, the non-volatile memory device 200 may be generated by stacking a plurality of the non-volatile memory devices 100a illustrated in FIG. 4. A plurality of control gate electrodes 150 may be vertically extended by penetrating a plurality of semiconductor layers 105. The number of the non-volatile memory devices 100a shown in FIG. 6 is exemplarily and the scope of example embodiments are not limited thereto.

A plurality of bit line plugs 180 may be disposed at ends of the control gate electrodes 150 and may be vertically extended to penetrate the semiconductor layers 105. For example, the bit line plugs 180 may be connected to the bit lines BL1, BL2, BL3, and BL4 illustrated in FIG. 5.

A plurality of common source line plugs 190 may be disposed at the other ends of the control gate electrodes 150 and may be vertically extended to penetrate the semiconductor layers 105. For example, the common source line plugs 190 may be connected to the common source line CSL illustrated in FIG. 5.

The non-volatile memory device 200 may have higher memory capacity, e.g., may be more highly integrated, by using the above-described stack structure.

Hereinafter, a method of operating the non-volatile memory device 100a illustrated in FIG. 4 will now be described in detail. The method will be described in conjunction with FIGS. 1 through 6.

Table 1 shows conditions for an example program operation of the non-volatile memory device 100a.

TABLE 1

| Program | First Page | Second Page |
|---------|------------|-------------|
| AL1 | 0 V | $V_{PI}$ |
| AL2 | $V_{PI}$ | 0 V |
| SEL_B/L | $V_{cc}$ | $V_{cc}$ |
| NOS_B/L | 0 V | 0 V |
| SEL_W/L | $V_{pgm}$ | $V_{pgm}$ |
| NOS_W/L | $V_{pass}$ | $V_{pass}$ |
| SSL | $V_{cc}$ | $V_{cc}$ |
| GSL | 0 V | 0 V |
| CSL | 0 V | 0 V |
| Bulk | 0 V | 0 V |

In Table 1, a selected bit line SEL_B/L represents one of the bit lines BL1, BL2, BL3, and BL4 which is selected for a program, and a non-selected bit line NOS_B/L represents other bit lines from among the bit lines BL1, BL2, BL3, and BL4, except for the selected one. A selected word line SEL_W/L represents one of the word lines WL00 through WL31 which is selected for a program, and a non-selected word line NOS_W/L represents other word lines from among the word lines WL00 through WL31, except for the selected one.

Referring to FIG. 5 and Table 1, the first pages BL1L, BL2R, BL3L, and BL4R may be programmed by a first page program and the second pages BL1R, BL2L, BL3R, and BL4L may be programmed by a second page program. The first page program may be executed by applying 0V to a first auxiliary line AL1 and applying a program inhibition voltage $V_{PI}$ to a second auxiliary line AL2, and/or the second page program may be executed by applying the program inhibition voltage $V_{PI}$ to the first auxiliary line AL1 and applying 0V to the second auxiliary line AL2. 0V may be referred to as a ground voltage.

The other conditions for the first and second programs may be the same. An operation voltage $V_{cc}$ may be applied to the selected bit line SEL_B/L and the string selection line SSL, and 0V may be applied to the non-selected bit line NOS_B/L and the ground selection line GSL. A program voltage $V_{pgm}$ may be applied to the selected word line SEL_W/L, and a pass voltage $V_{pass}$ may be applied to the non-selected word line NOS_W/L. 0V may be applied to the common source line CSL and the semiconductor layer 105, i.e., Bulk.

The program voltage $V_{pgm}$ may be selected in order to enable tunnelling of charges from the semiconductor layer 105 to charge storage layers 130 and/or the pass voltage $V_{pass}$ may be selected in order to turn on the memory cells MC.

For example, the program inhibition voltage $V_{PI}$ may have a positive value greater than zero. In this case, the channel potential of the first region 102 or the second region 104, to which a positive program inhibition voltage $V_{PI}$ is applied, may have a positive value. The application of the positive program inhibition voltage $V_{PI}$ may correspond to a case if a channel boosting voltage is applied to the bit lines BL1, BL2, BL3, and BL4. However, application of the positive program inhibition voltage $V_{PI}$ may be more advantageous in that the positive program inhibition voltage $V_{PI}$ may be selectively applied to the first region 102 or the second region 104.

In the first page program, the channel potential of the memory cells MC of the second region 104, which is capacitively coupled with the positive program inhibition voltage $V_{PI}$ applied to the second auxiliary line AL2, may be increased. Therefore, the second page program of the second pages BL1R, BL2L, BL3R, and BL4L may be inhibited. For example, if the program voltage $V_{pgm}$ is about 15V through 20V, the positive program inhibition voltage $V_{PI}$ may be about 7V though 15V. On the other hand, the first page program of the first pages BL1L, BL2R, BL3L, and BL4R may be available because 0V is applied to the first auxiliary line AL1.

In the second page program, the channel potential of the memory cells MC of the first region 102, which is capacitively coupled with the positive program inhibition voltage $V_{PI}$ applied to the first auxiliary line AL1, may be increased. Therefore, the first page program of the first pages BL1L, BL2R, BL3L, and BL4R may be inhibited. On the other hand, the second page program of the second pages BL1R, BL2L, BL3R, and BL4L may be available because 0V is applied to the second auxiliary line AL2.

As another example, the program inhibition voltage $V_{PI}$ may have a negative value less than zero. For example, the channel potential of the first region 102 or the second region 104, to which a negative program inhibition voltage $V_{PI}$ is applied, may have a negative value. The application of the negative program inhibition voltage $V_{PI}$ may corresponds to a case if a negative bias voltage is applied to the semiconductor layer 105. However, application of the negative program inhibition voltage $V_{PI}$ may be more advantageous in that the negative program inhibition voltage $V_{PI}$ may be selectively applied to the first region 102 or the second region 104.

Figure 7:
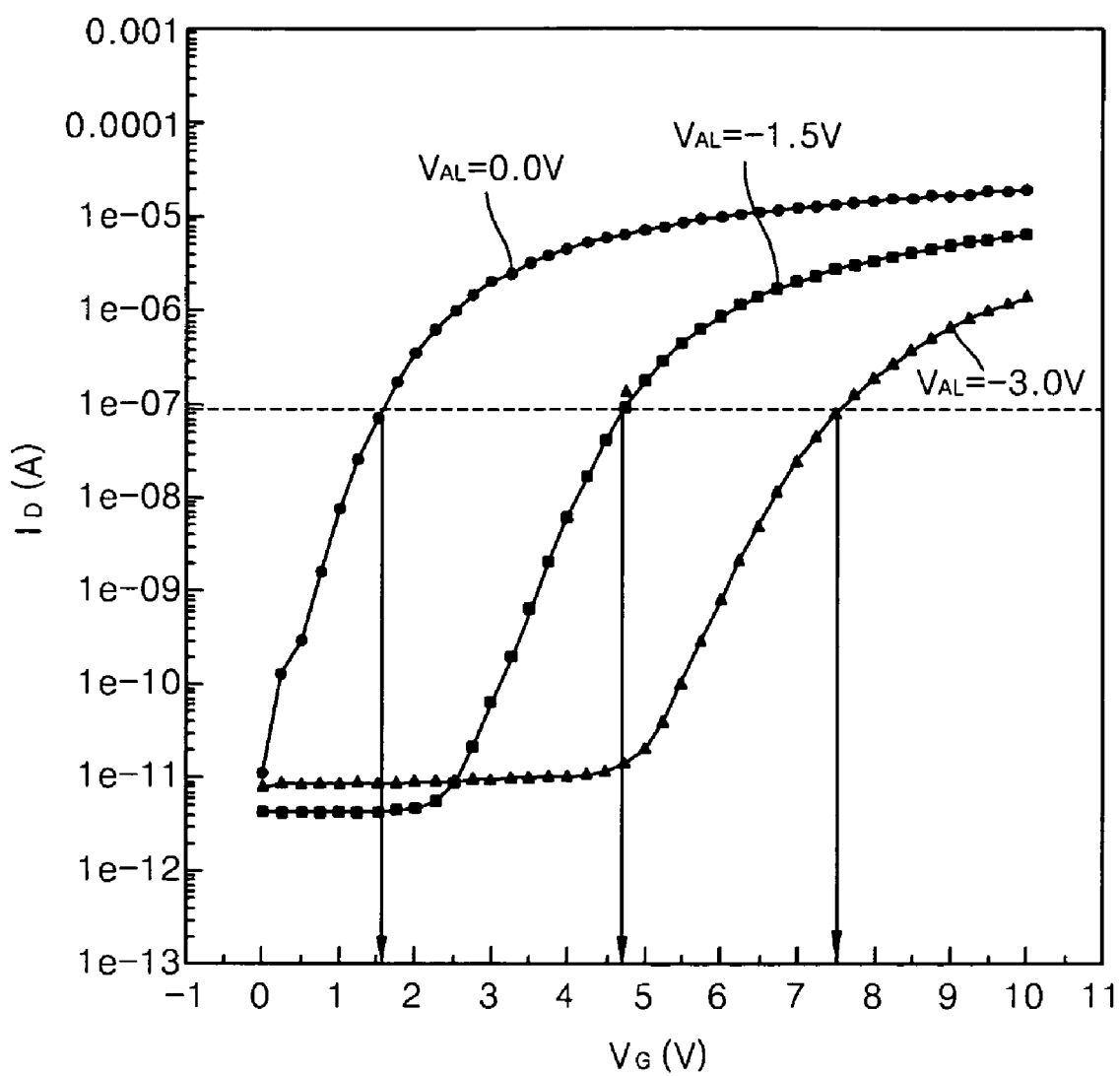
FIG. 7 is an example graph showing example operation characteristics of a non-volatile memory device according to an example embodiment.

FIG. 7 is an example graph showing example operation characteristics of a non-volatile memory device according to an example embodiment.

As illustrated in FIG. 7, as an absolute value of a bias voltage $V_{AL}$ applied to the first auxiliary line AL1 or the second auxiliary line AL2 is increased, a threshold voltage of the string selection transistors ST is increased. For example, if a value of the bias voltage $V_{AL}$ is changed from about 0.0V to −3.0V, a voltage $V_G$ applied to a gate in order to induce a current $I_D$ of 1.0e-7 is increased from about 1.5V to 7.5V. Accordingly, the string selection transistors ST may be turned off by using the negative program inhibition voltage $V_{PI}$. For example, the program inhibition voltage $V_{PI}$ may have a value in a range of about −5V through −20V in order to effectively turn off the string selection transistors ST.

In the first page program, the electric potential of the second region 104, which is capacitively coupled with the negative program inhibition voltage $V_{PI}$ applied to the second auxiliary line AL2, may be negatively increased. Accordingly, the string selection transistors ST of the second pages BL1R, BL2L, BL3R, and BL4L may be turned off and the channel charge of the memory cells MC may be depleted. In an incremental step pulse programming (ISPP) method, the program voltage $V_{pgm}$ may be supplied in relatively very short pulses so that a program may be inhibited if charges are not supplied to a channel. Therefore, the second page program of the second pages BL1R, BL2L, BL3R, and BL4L may be inhibited. On the other hand, the first page program of the first pages BL1L, BL2R, BL3L, and BL4R may be available because 0V is applied to the first auxiliary line AL1.

In the second page program, the electric potential of the first region 102, which is capacitively coupled with the negative program inhibition voltage $V_{PI}$ applied to the first auxiliary line AL1, may be negatively increased. Therefore, the first page program of the first pages BL1L, BL2R, BL3L, and BL4R may be inhibited. On the other hand, the second page program of the second pages BL1R, BL2L, BL3R, and BL4L may be available because 0V is applied to the second auxiliary line AL2.

Table 2 shows conditions for example read operations of the non-volatile memory device 100a.

TABLE 2

| Read | First Page | Second Page |
|---|---|---|
| AL1 | 0 V | $V_{RI}$ |
| AL2 | $V_{RI}$ | 0 V |
| SEL_B/L | $V_{cc}$ | $V_{cc}$ |
| NOS_B/L | 0 V | 0 V |
| SEL_W/L | $V_{read}$ | $V_{read}$ |
| NOS_W/L | $V_{pass}$ | $V_{pass}$ |
| SSL | $V_{cc}$ | $V_{cc}$ |
| GSL | $V_{cc}$ | $V_{cc}$ |
| CSL | 0 V | 0 V |
| Bulk | 0 V | 0 V |

Referring to FIG. 5 and Table 2, the first pages BL1L, BL2R, BL3L, and BL4R may be read by a first page read operation and the second pages BL1R, BL2L, BL3R, and BL4L may be read by a second page read operation. The first page read operation may be performed by applying 0V to the first auxiliary line AL1 and applying a read inhibition voltage $V_{RI}$ to the second auxiliary line AL2, and/or the second page read operation may be performed by applying the read inhibition voltage $V_{RI}$ to the first auxiliary line AL1 and applying 0V to the second auxiliary line AL2.

The other conditions for the first and second read operations may be the same. An operation voltage $V_{cc}$ may be applied to the selected bit line SEL_B/L, the string selection line SSL, and the ground selection line GSL, and 0V may be applied to the non-selected bit line NOS_B/L. A read operation voltage $V_{read}$ may be applied to the selected word line SEL_W/L, and a pass voltage $V_{pass}$ may be applied to the non-selected word line NOS_W/L. 0V may be applied to the common source line CSL and the semiconductor layer 105, Bulk. The read operation voltage $V_{read}$ may be selected in order to read data states of the memory cells MC.

The read inhibition voltage $V_{RI}$ may have, for example, a negative value less than zero. Similar to the negative program inhibition voltage $V_{PI}$, a negative read inhibition voltage $V_{RI}$ may turn off the string selection transistors ST.

For example, an erase operation may be performed in block units by applying an erase voltage to the semiconductor layer 105, i.e., Bulk, and applying 0V to the word lines WL00 through WL31. As another example, the erase voltage may be applied to the first and second auxiliary lines AL1 and AL2, instead of being applied to the semiconductor layer 105, i.e., Bulk. As another example, the erase voltage may be simultaneously applied to the semiconductor layer 105, i.e., Bulk, and the first and second auxiliary lines AL1 and AL2. The erase voltage may be, for example, approximately 20V.

The above-described method may be easily applied to the non-volatile memory device 200 illustrated in FIG. 6. For example, a program may be executed or a reading operation may be performed on a selected semiconductor layer 105 by applying the program inhibition voltage $V_{PI}$ or the read inhibition voltage $V_{RI}$ on unselected semiconductor layers 105.

FIGS. 8 through 16 are perspective views for describing a method of fabricating a non-volatile memory device according to an example embodiment.

Figure 8:
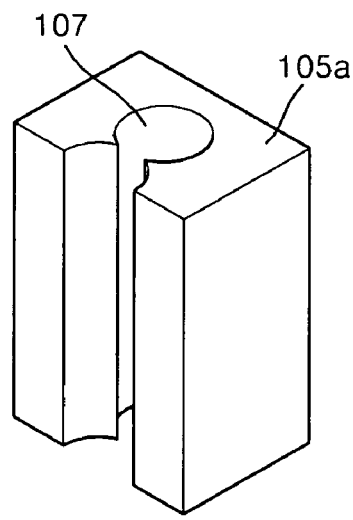
FIGS. 8 through 16 are perspective views for describing a method of fabricating a non-volatile memory device according to an example embodiment.
Figure 9:
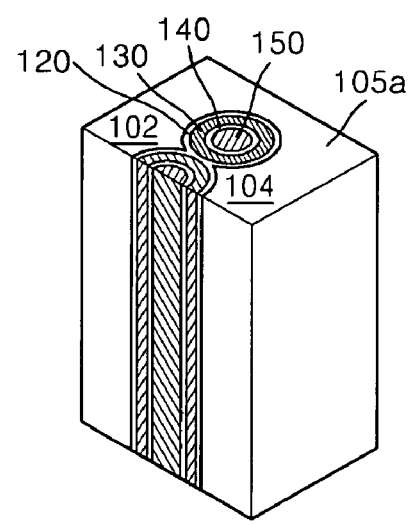

Referring to FIG. 8, a plurality of grooves 107 may be formed in a semiconductor substrate 105a. The semiconductor substrate 105a illustrated in FIG. 8 may be a part of a bulk semiconductor wafer. A distance between the grooves 107 may be adjusted so that a plurality of tunnelling insulation layers 120 to be formed later, e.g., as illustrated in FIG. 9, may be connected to each other. If the distance between grooves is too large, the tunnelling insulation layers 120 may not be as easily connected to each other.

Referring to FIG. 9, the tunnelling insulation layers 120 may be formed on surfaces of the grooves 107. For example, the tunnelling insulation layers 120 may be formed by thermally oxidizing the semiconductor substrate 105a. Accordingly, the tunnelling insulation layers 120 may be formed to be relatively closer to each other and may finally contact each other. Therefore, the semiconductor substrate 105a may include first and second regions 102 and 104 which are separated by the tunnelling insulation layers 120.

A plurality of charge storage layers 130 may be formed on the tunnelling insulation layers 120 in the grooves 107. A plurality of blocking insulation layers 140 may be formed on the charge storage layers 130 in the grooves 107. A plurality of control gate electrodes 150 may be formed on the blocking insulation layers 140 to fill the grooves 107.

Figure 10:
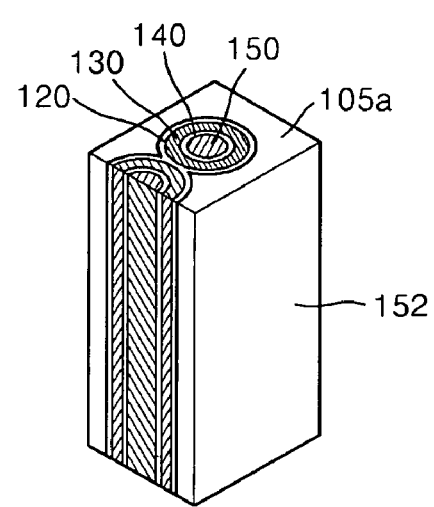

Referring to FIG. 10, a pair of trenches 152 may be formed on both sides of the control gate electrodes 150 of the semiconductor substrate 105a. Therefore, the width of the first and second regions 102 and 104 may be reduced.

Figure 11:
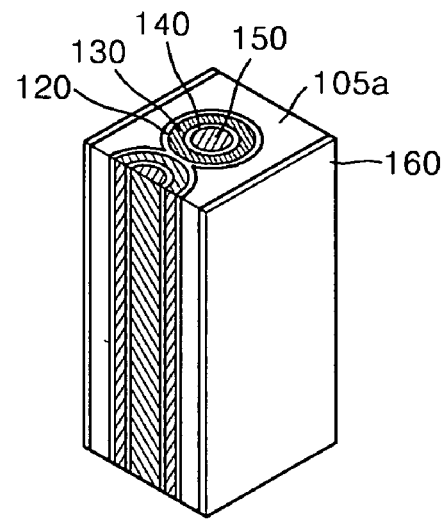

Referring to FIG. 11, dielectric layers 160 may be formed on surfaces of the semiconductor substrate 105a exposed by the trenches 152. For example, the dielectric layers 160 may be formed by using a thermal oxidization method or a chemical vapor deposition (CVD) method.

Figure 12:
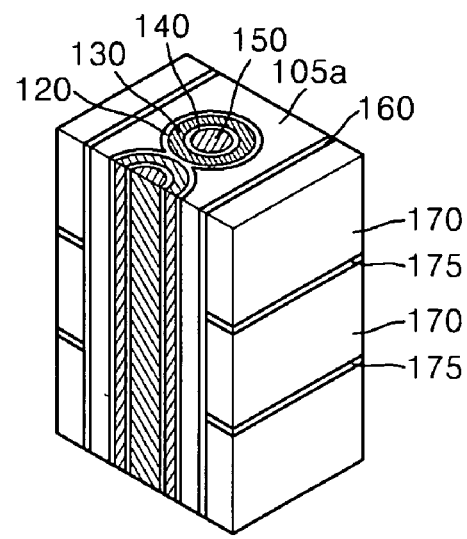

Referring to FIG. 12, first and second conductive layers 170 and 175 may be alternately stacked along the control gate electrodes 150 on the dielectric layers 160 in the trenches 152. The first and second conductive layers 170 and 175 may have different etch selectivities. For example, the first conductive layers 170 may include silicon and the second conductive layers 175 may include silicon-germanium.

Figure 13:
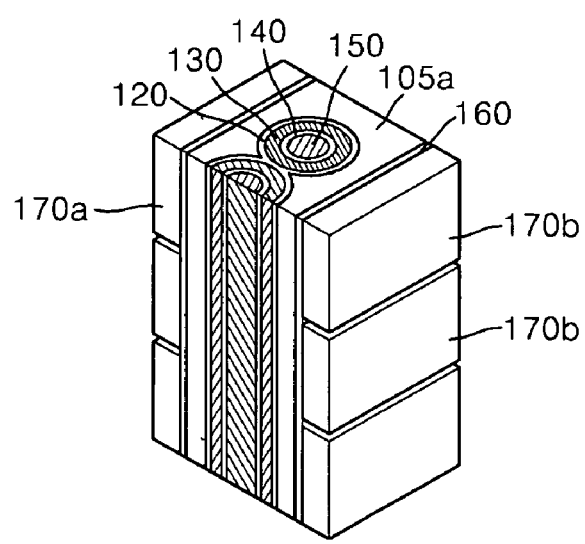

Referring to FIG. 13, a plurality of first and second auxiliary electrodes 170a and 170b, which are formed of the first conductive layers 170, may be defined in a stack structure by selectively removing the second conductive layers 175. The first auxiliary electrodes 170a may be defined in the first region 102 and/or the second auxiliary electrodes 170b may be defined in the second region 104. Therefore, the dielectric layers 160 may be partially exposed between the first auxiliary electrodes 170a and between the second auxiliary electrodes 170b. For example, the second conductive layers 175 may be selectively removed by using a wet etching method.

Figure 14:
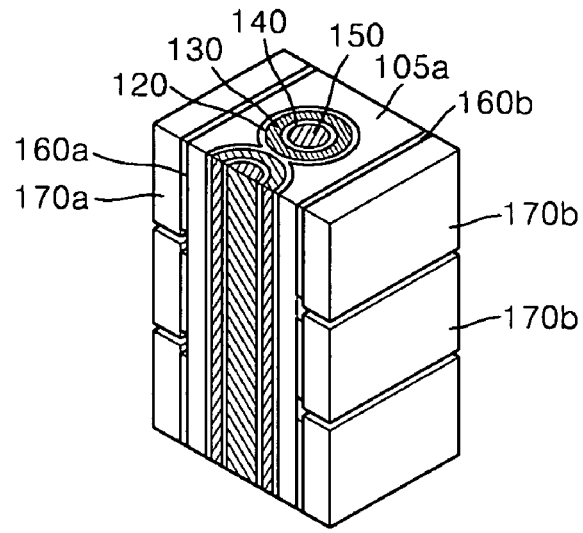

Referring to FIG. 14, a plurality of first and second dielectric layers 160a and 160b may be defined in a stack structure by selectively removing the exposed parts of the dielectric layers 160. The first dielectric layers 160a may be disposed between the semiconductor substrate 105a and the first auxiliary electrodes 170a, and/or the second dielectric layers 160b may be disposed between the semiconductor substrate 105a and the second auxiliary electrodes 170b. Therefore, parts of the semiconductor substrate 105a may be exposed between the first dielectric layers 160a and between the second dielectric layers 160b. For example, the exposed parts of the dielectric layers 160 may be selectively removed by using a wet etching method.

Figure 15:
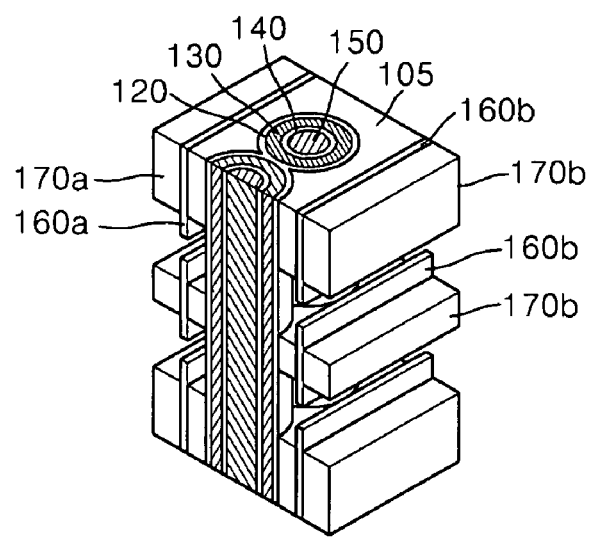

Referring to FIG. 15, a plurality of semiconductor layers 105 in a stack structure may be defined by selectively removing the exposed parts of the semiconductor substrate 105a. For example, the exposed parts of the semiconductor substrate 105a may be selectively removed by using a wet etching method. Accordingly, the semiconductor layers 105 in a stack structure may be formed without using a silicon-on-insulator (SOI) substrate.

Figure 16:
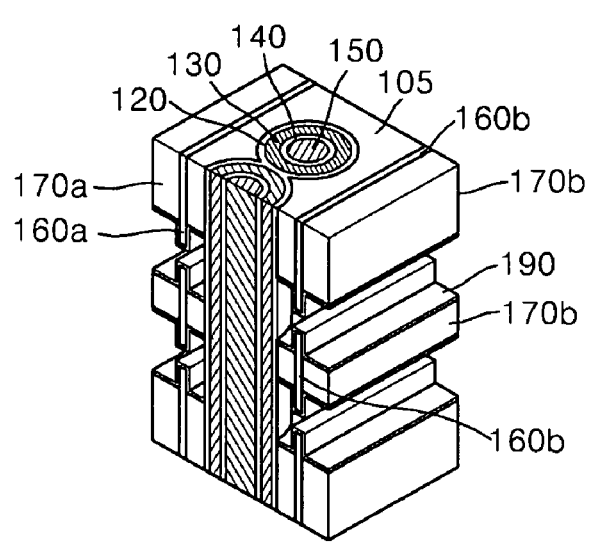

Referring to FIG. 16, a plurality of passivation layers 195 may be formed on surfaces of the semiconductor layers 105. For example, the passivation layers 195 may be formed by using a thermal oxidization method or a CVD method. A plurality of interlayer insulation layers (not shown) may be formed between the semiconductor layers 105.

According to the above-described method, a non-volatile memory device may be more economically fabricated by using a bulk semiconductor wafer instead of a SOI substrate.

As described above, a non-volatile memory device according to example embodiments may have a recess structure or a trench structure, and/or may operate at a higher speed.

A non-volatile memory device according to an example embodiment may have two pages in a NAND string to process at least two-bit data. Therefore, the non-volatile memory device may have a higher capacity and/or more effectively process greater amounts of data.

Furthermore, a non-volatile memory device according to an example embodiment may omit source and/or drain regions to be more highly integrated. The non-volatile memory device may be more easily extended to a stack structure by using a bulk semiconductor wafer. Accordingly, the non-volatile memory device may be more easily and highly integrated and/or may have a higher reliability.

Although example embodiments have been shown and described in this specification and figures, it would be appreciated by those skilled in the art that changes may be made to the illustrated and/or described example embodiments without departing from their principles and spirit.

What is claimed is:

1. A non-volatile memory device comprising:
   at least one semiconductor layer;
   a plurality of control gate electrodes recessed into the semiconductor layer;
   a plurality of charge storage layers between the plurality of control gate electrodes and the semiconductor layer; and
   at least one first auxiliary electrode and at least one second auxiliary electrode, the first and second auxiliary electrodes arranged to face each other, and wherein the plurality of control gate electrodes are between the first and second auxiliary electrodes and are capacitively coupled with the semiconductor layer.

2. The non-volatile memory device of claim 1, wherein the plurality of charge storage layers surround side walls of the plurality of control gate electrodes.

3. The non-volatile memory device of claim 1, further comprising:
   a plurality of tunneling insulation layers between the plurality of charge storage layers and the semiconductor layer, wherein the plurality of tunneling insulation layers are connected to each other.

4. The non-volatile memory device of claim 3, further comprising:
   a plurality of blocking insulation layers between the plurality of control gate electrodes and the plurality of charge storage layers.

5. The non-volatile memory device of claim 4, wherein the plurality of tunneling insulation layers and the plurality of blocking insulation layers surround side walls of the plurality of control gate electrodes.

6. The non-volatile memory device of claim 3, wherein the plurality of tunneling insulation layers separate the semiconductor layer into first and second regions to sides of the plurality of control gate electrodes.

7. The non-volatile memory device of claim 6, wherein the first auxiliary electrode is recessed into the first region and the second auxiliary electrode is recessed into the second region.

8. The non-volatile memory device of claim 7, further comprising:
   a first dielectric layer between the first auxiliary electrode and the semiconductor layer; and a second dielectric layer between the second auxiliary electrode and the semiconductor layer.

9. The non-volatile memory device of claim 1, wherein the first auxiliary electrode is on sides of the plurality of control gate electrodes in a line.

10. The non-volatile memory device of claim 1, wherein the second auxiliary electrode is on sides of the plurality of control gate electrodes in a line.

11. The non-volatile memory device of claim 1, wherein the first and second auxiliary electrodes are symmetrically arranged with respect to each other about the plurality of control gate electrodes.

12. The non-volatile memory device of claim 1, wherein
the at least one semiconductor layer is a plurality of semiconductor layers;
the plurality of control gate electrodes are extended to penetrate the plurality of semiconductor layers;
the plurality of charge storage layers are between the plurality of control gate electrodes and the plurality of semiconductor layers;
the at least one first auxiliary electrode is a plurality of first auxiliary electrodes on first sides of the plurality of control gate electrodes and capacitively coupled with the plurality of semiconductor layers; and
the at least one second auxiliary electrode is a plurality of second auxiliary electrodes on second sides of the plurality of control gate electrodes and capacitively coupled with the plurality of semiconductor layers.

13. The non-volatile memory device of claim 12, wherein the plurality of first auxiliary electrodes are recessed into the plurality of semiconductor layers.

14. The non-volatile memory device of claim 12, wherein the plurality of second auxiliary electrodes are recessed into the plurality of semiconductor layers.

15. The non-volatile memory device of claim 12, further comprising:
a plurality of bit line plugs at ends of the plurality of control gate electrodes, the plurality of bit line plugs extended to penetrate the plurality of semiconductor layers.

16. The non-volatile memory device of claim 12, further comprising:
a plurality of common source line plugs at the other ends of the plurality of control gate electrodes, the plurality of common source line plugs extended to penetrate the plurality of semiconductor layers.

17. The non-volatile memory device of claim 12, further comprising:
a plurality of tunneling insulation layers between the plurality of charge storage layers and the plurality of semiconductor layers, the plurality of tunneling insulation layers connected to each other.

18. The non-volatile memory device of claim 12, further comprising:
a plurality of blocking insulation layers between the plurality of control gate electrodes and the plurality of charge storage layers.

19. A method of operating a non-volatile memory device, the method comprising:
performing a program operation including storing data into at least one of a plurality of memory cells connected to each other by a NAND (NOT AND) string between a bit line and a common source line,
wherein the NAND string comprises first and second pages, and
wherein the program operation includes performing a first page program operation including applying a ground voltage to a first auxiliary line capacitively coupled with the first page of a semiconductor layer and applying a program inhibition voltage to a second auxiliary line capacitively coupled with the second page of the semiconductor layer.

20. The method of claim 19, wherein the program operation further includes a second page program operation including applying the program inhibition voltage to the first auxiliary line capacitively coupled with the first page of the semiconductor layer and applying the ground voltage to the second auxiliary line capacitively coupled with the second page of the semiconductor layer.

21. The method of claim 19, wherein the program inhibition voltage is a positive value.

22. The method of claim 19, wherein the program inhibition voltage is a negative value.

23. The method of claim 19, further comprising:
performing a read operation including reading data from at least one of the memory cells,
wherein the read operation includes a first page read operation applying the ground voltage to the first auxiliary line capacitively coupled with the first page of the semiconductor layer and applying a read inhibition voltage to the second auxiliary line capacitively coupled with the second page of the semiconductor layer.

24. The method of claim 23, wherein the read operation further includes a second page read operation including applying the read inhibition voltage to the first auxiliary line capacitively coupled with the first page of the semiconductor layer and applying the ground voltage to the second auxiliary line capacitively coupled with the second page of the semiconductor layer.

25. The method of claim 23, wherein the read inhibition voltage is a negative value.

26. A method of fabricating a non-volatile memory device, the method comprising:
forming a plurality of charge storage layers in a semiconductor substrate;
forming a plurality of control gate electrodes on the plurality of charge storage layers;
forming at least one first auxiliary electrode on first sides of the plurality of control gate electrodes and capacitively coupled with the semiconductor substrate; and
forming at least one second auxiliary electrode on second sides of the plurality of control gate electrodes and capacitively coupled with the semiconductor substrate.

27. The method of claim 26, further comprising:
forming a plurality of grooves by etching the semiconductor substrate, wherein the plurality of charge storage layers are formed in the plurality of grooves, and the plurality of control gate electrodes are formed on the plurality of charge storage layers in the plurality of grooves.

28. The method of claim 27, further comprising:
forming a plurality of tunneling insulation connected to each other on the plurality of grooves, before the forming of the plurality of charge storage layers.

29. The method of claim 27, further comprising:
forming a plurality of blocking insulation layers on the plurality of charge storage layers in the plurality of grooves, before the forming of the plurality of control gate electrodes.

30. The method of claim 27, further comprising:
forming a pair of trenches in the semiconductor substrate, the plurality of control gate electrodes disposed between the trenches; and
forming dielectric layers on the trenches, before the forming of the at least one first auxiliary electrode.

31. The method of claim 30, wherein the at least one first auxiliary electrode comprises a plurality of first auxiliary electrodes and the at least one second auxiliary electrode comprises a plurality of second auxiliary electrodes.

32. The method of claim 31, further comprising:
alternately stacking a plurality of first and second conductive layers on the dielectric layers in the trenches; and
defining the plurality of first conductive layers into the plurality of first and second auxiliary electrodes by selectively removing the plurality of second conductive layers, after the forming of the dielectric layers.

33. The method of claim 32, wherein the plurality of first conductive layers include silicon and the plurality of second conductive layers include silicon-germanium.

34. The method of claim 32, further comprising:
etching parts of the dielectric layers exposed between the plurality of first auxiliary electrodes and between the plurality of second auxiliary electrodes, after the selective removal of the plurality of second conductive layers, and
wherein remaining parts of the dielectric layers define a plurality of first dielectric layers between the plurality of first auxiliary electrodes and the semiconductor substrate and a plurality of second dielectric layers between the plurality of second auxiliary electrodes and the semiconductor substrate.

35. The method of claim 34, wherein the parts of the dielectric layers are etched with a wet etching method.

36. The method of claim 35, further comprising:
separating the semiconductor substrate into a plurality of semiconductor layers by selectively etching parts of the semiconductor substrate exposed between the plurality of first auxiliary electrodes and between the plurality of second auxiliary electrodes, after the etching of the parts of the dielectric layers.

37. The method of claim 36, wherein the parts of the semiconductor substrate are etched with a wet etching method.

38. The method of claim 36, further comprising:
forming a plurality of passivation layers on the plurality of semiconductor layers after the forming of the plurality of semiconductor layers.

* * * * *